(12) United States Patent
de Lyon et al.

(10) Patent No.: US 9,818,896 B1
(45) Date of Patent: Nov. 14, 2017

(54) GRADED INFRARED PHOTODETECTOR AND METHOD

(71) Applicant: The Boeing Company, Chicago, IL (US)

(72) Inventors: Terence de Lyon, Newbury Park, CA (US); Sevag Terterian, Lake Balboa, CA (US); Hasan Sharifi, Agoura Hills, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/373,207

(22) Filed: Dec. 8, 2016

(51) Int. Cl.
*H01L 31/02* (2006.01)
*H01L 31/10* (2006.01)
*H01L 31/18* (2006.01)
*H01L 27/14* (2006.01)
*H01L 31/0352* (2006.01)
*H01L 31/109* (2006.01)
*H01L 31/0216* (2014.01)
*H01L 31/0304* (2006.01)
*H01L 27/144* (2006.01)

(52) U.S. Cl.
CPC .. *H01L 31/035272* (2013.01); *H01L 27/1443* (2013.01); *H01L 31/02161* (2013.01); *H01L 31/03046* (2013.01); *H01L 31/109* (2013.01); *H01L 31/1844* (2013.01)

(58) Field of Classification Search
CPC ....... H01L 31/035272; H01L 31/02161; H01L 31/03046; H01L 31/109; H01L 31/1844; H01L 27/1443
See application file for complete search history.

(56) References Cited

U.S. PATENT DOCUMENTS

| | | | |
|---|---|---|---|
| 6,455,908 B1* | 9/2002 | Johnson | B82Y 20/00 257/184 |
| 6,720,589 B1* | 4/2004 | Shields | B82Y 10/00 257/14 |
| 7,652,252 B1 | 1/2010 | Rajavel et al. | |
| 7,687,871 B2 | 3/2010 | Maimon | |
| 7,795,640 B2 | 9/2010 | Klipstein | |
| 7,800,067 B1 | 9/2010 | Rajavel et al. | |
| 8,450,773 B1* | 5/2013 | Kim | H01L 31/1844 250/338.4 |
| 8,772,826 B2* | 7/2014 | Asao | H01L 31/0322 257/104 |
| 8,835,979 B1 | 9/2014 | de Lyon et al. | |
| 9,024,296 B2* | 5/2015 | Sundaram | H01L 27/1463 257/21 |

(Continued)

OTHER PUBLICATIONS

Maimon, et al. "nBn detector, an infrared detector with reduced dark current and higher operating temperature". American Institute of Physics; Applied Physics Letters, vol. 89, Issue 151109, 2006; doi:10.1063/1.2360235; http://dx.doi.org/10.1063/1.2360235.

(Continued)

*Primary Examiner* — Ida M Soward
(74) *Attorney, Agent, or Firm* — Perman & Green, LLP

(57) ABSTRACT

An infrared photodetector including a substrate, a barrier layer, and an absorber layer disposed between the substrate and the barrier layer, the absorber layer having a molar concentration grading that results in an uncoated quantum efficiency of greater than about 40 percent.

20 Claims, 5 Drawing Sheets

(56) References Cited

U.S. PATENT DOCUMENTS

| | | | | |
|---|---|---|---|---|
| 9,064,992 | B1* | 6/2015 | Nosho | H01L 31/02016 |
| 9,076,906 | B2* | 7/2015 | Ogura | H01L 31/1105 |
| 9,231,137 | B1* | 1/2016 | Sharifi | H01L 31/11 |
| 9,293,612 | B1* | 3/2016 | De Lyon | H01L 31/11 |
| 9,647,155 | B1* | 5/2017 | Maimon | H01L 31/035236 |
| 9,673,347 | B2* | 6/2017 | Kinch | H01L 31/1832 |
| 9,698,192 | B1* | 7/2017 | Crook | H01L 27/14652 |
| 9,748,427 | B1* | 8/2017 | Rajavel | H01L 31/102 |
| 2009/0127462 | A1 | 5/2009 | Gunapala et al. | |
| 2009/0184383 | A1* | 7/2009 | Seeds | G02B 6/12004 257/432 |
| 2012/0145996 | A1* | 6/2012 | Ting | B82Y 20/00 257/21 |
| 2013/0214373 | A9* | 8/2013 | Scott | H01L 27/14603 257/443 |
| 2014/0225064 | A1* | 8/2014 | Khoshakhlagh | H01L 31/035236 257/21 |
| 2014/0332755 | A1* | 11/2014 | Wei | H01L 31/035236 257/21 |
| 2015/0311375 | A1* | 10/2015 | Shen | H01L 31/1075 257/77 |
| 2016/0336475 | A1* | 11/2016 | Mackie | H01L 31/0749 |

OTHER PUBLICATIONS

Klem, et al. "Mesa-isolated InGaAs photodetectors with low dark current". American Institute of Physics; Applied Physics Letters, vol. 95, 031112, 2009; doi:10.1063/1.3184807; http://dx.doi.org/10.1063/1.3184807.

Klem, et al "Epitaxially passivated mesa-isolated InGaAs photodetectors", Proc. SPIE 8704, Infrared Technology and Applications XXXIX, vol. 8704, 870402, 2013; doi:10.1117/12.2016558; http://dx.doi.org/10.1117/12.2016558.

Wicks, et al. "Extended-shortwave infrared unipolar barrier detectors", Proc. SPIE 9370, Quantum Sensing and Nanophotonic Devices XII, vol. 9370, 937023, 2015; doi:10.1117/12.2083861; http://dx.doi.org/10.1117/12.2083861.

* cited by examiner

GRADED INFRARED PHOTODETECTOR AND METHOD

BACKGROUND

1. Field

The exemplary embodiments generally relate to photodetectors and in particular to short wave infrared photodetectors.

2. Brief Description of Related Developments

Imaging systems are used to detect a range of electromagnetic radiation spectral bands. These electromagnetic radiation spectral bands include the visible band and the infrared band. Generally, these imaging systems may be used for a variety of applications such as detection of chemicals, underground structures, people, vehicles, etc. In one aspect, the imaging systems may use a focal plane array that includes an array of photodetector elements where each of the photodetector elements functions as a pixel to produce an image of detected items. A change in signal level output of each of the photodetector elements due to interaction with incident electromagnetic radiation is converted into a multiplexed (or time multiplexed) electrical signal by any suitable circuitry, such as a readout integrated circuit.

Generally photodetector elements of the conventional imaging systems, such as imaging systems using barrier detectors, include photon-absorbing layers of alloy semiconducting materials such as gallium indium arsenide (GaInAs) or aluminum indium arsenide (AlInAs) where the absorber layers have a uniform alloy composition. These gallium indium arsenide and aluminum indium arsenide absorber layers of uniform composition are generally grown on a gallium arsenide substrate and result in photodetector elements having a quantum efficiency (QE) of less than about 15% (noting the quantum efficiency of a photodetector cannot be greater than 100%) when the photodetector elements are not coated with an optical enhancing coating (e.g., such as an antireflective coating). The low quantum efficiency (e.g., of less than about 15%) may be due to either a bulk minority carrier lifetime limitation or due to recombination at the interface between the substrate and absorber layer.

SUMMARY

Accordingly, a system and method, intended to address one or more of the above-identified (or other) concerns, would find utility. The following is a non-exhaustive list of examples, which may or may not be claimed, of the subject matter according to the present disclosure.

One example of the subject matter according to the present disclosure relates to an infrared photodetector including a substrate, a barrier layer, and an absorber layer disposed between the substrate and the barrier layer, the absorber layer having a molar concentration grading that results in an uncoated quantum efficiency of greater than about 40 percent.

Another example of the subject matter according to the present disclosure relates to an infrared photodetector including a plurality of pixels forming an array of two or more pixels, the plurality of pixels having a substrate, a barrier layer, and an absorber layer disposed between the substrate and the barrier layer, the absorber layer having a molar concentration grading that results in an uncoated quantum efficiency of greater than about 40 percent.

Still another example of the subject matter according to the present disclosure relates to a method of forming an infrared photodetector where the method includes growing an absorber layer on a substrate, growing a barrier layer on the absorber layer, and wherein the absorber layer is grown such that the absorber layer has a molar concentration grading that effects an uncoated quantum efficiency of greater than about 40 percent.

BRIEF DESCRIPTION OF THE DRAWINGS

Figure 1:
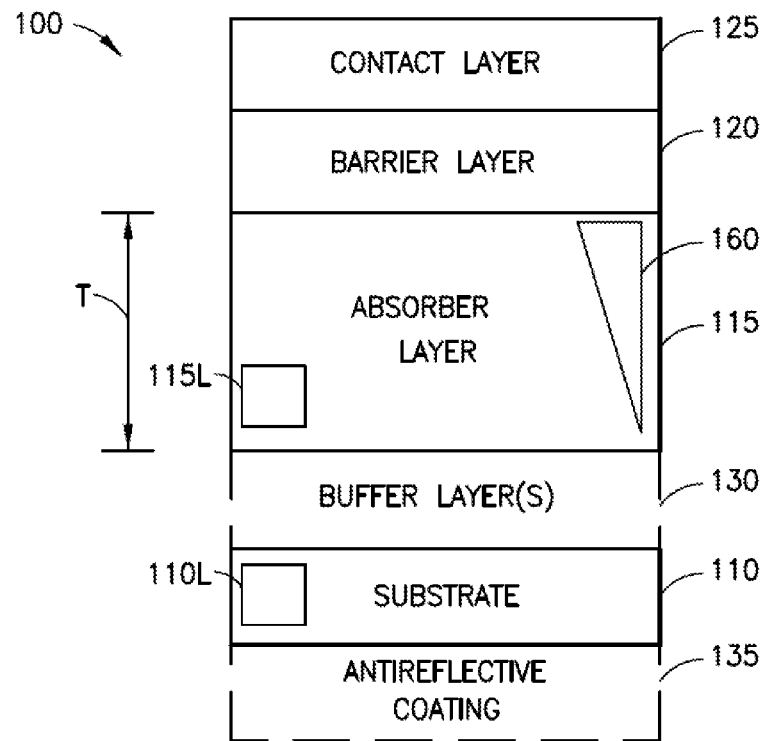
Figure 2:
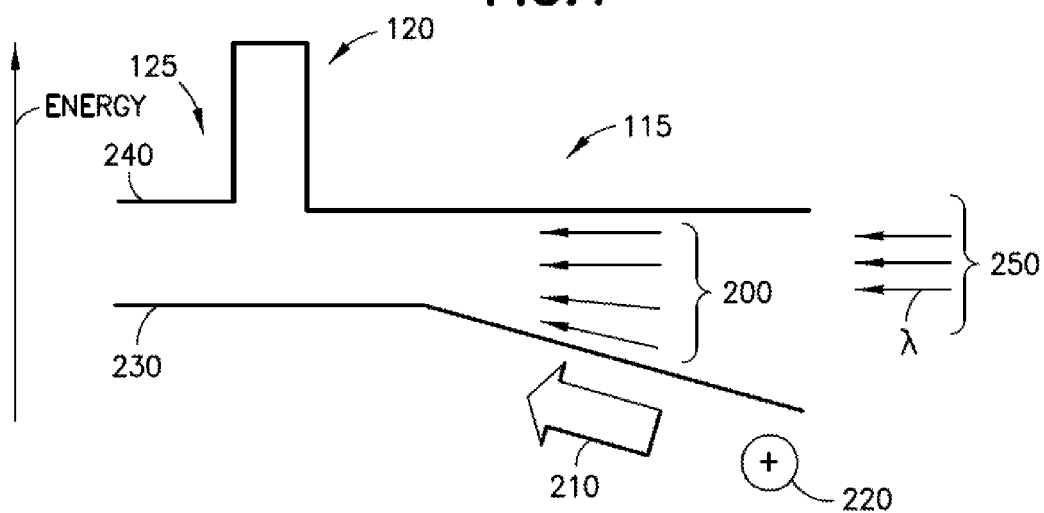
Figure 3:
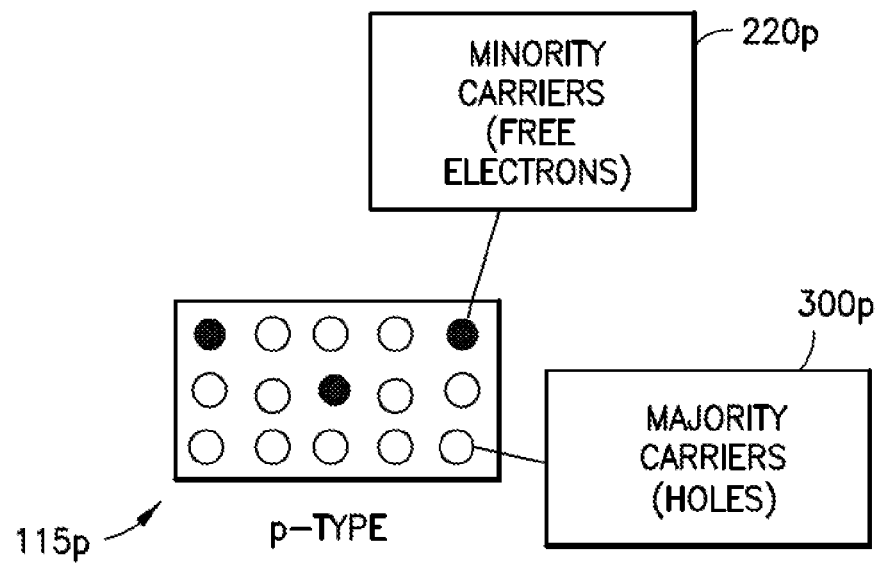
Figure 4:
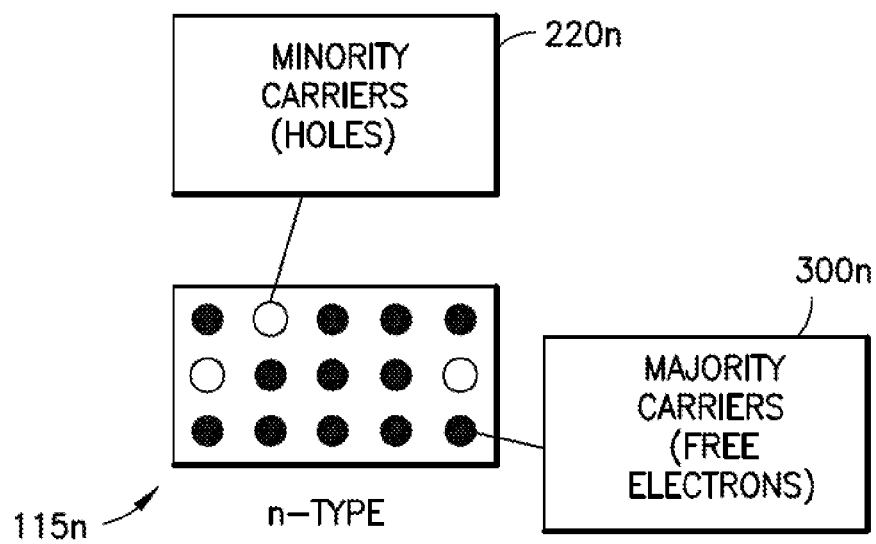
Figure 5:
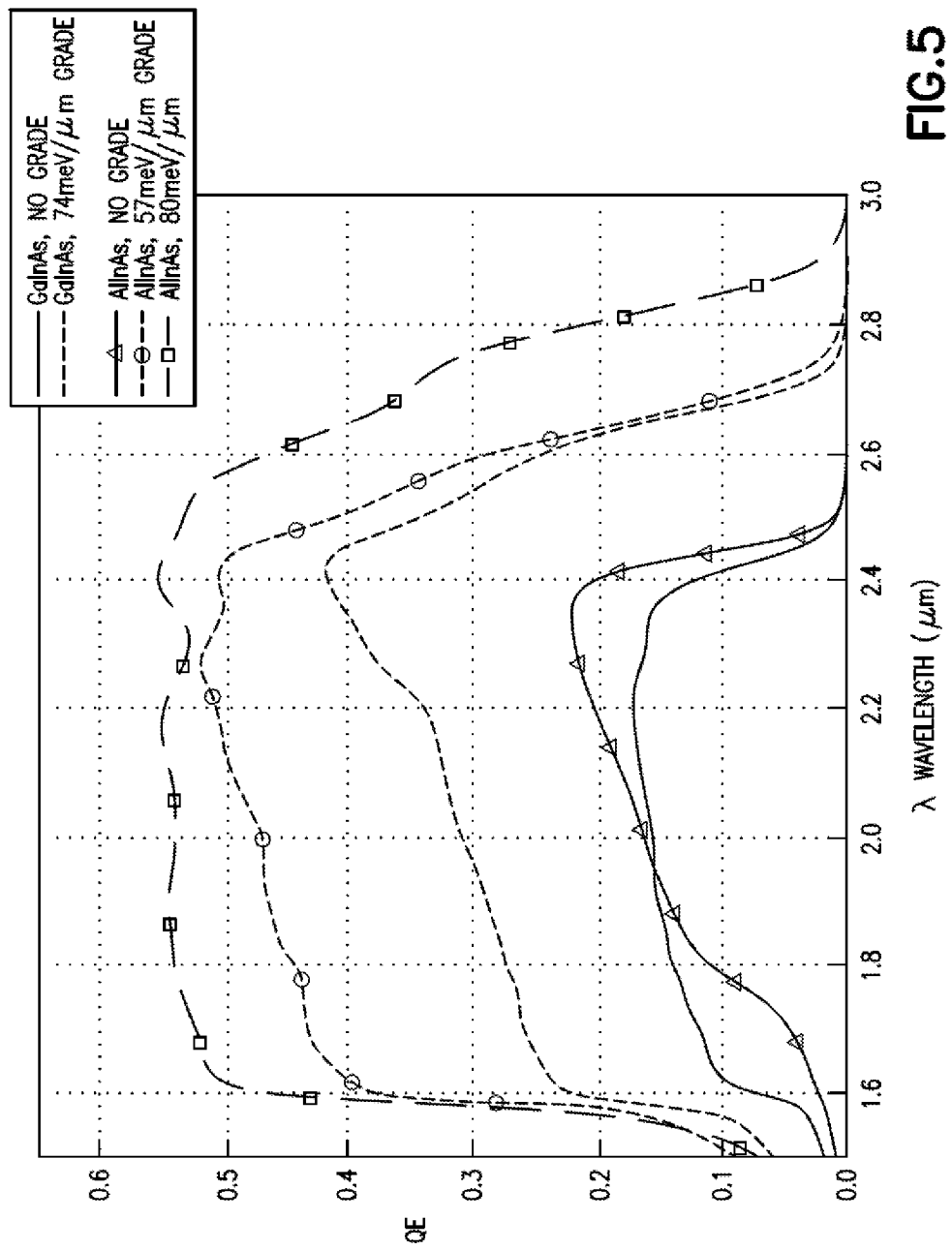
Figure 6:
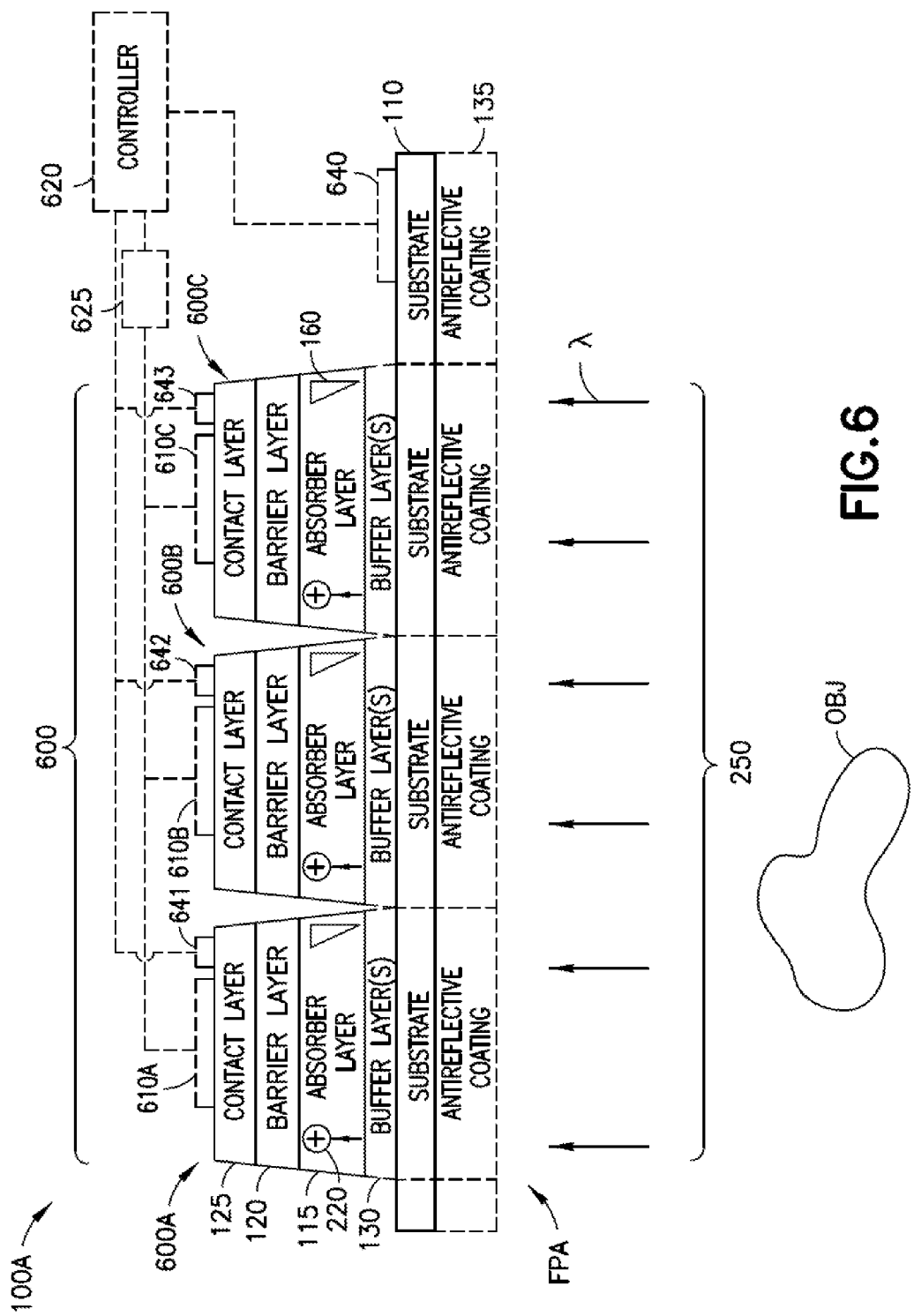
Figure 7:
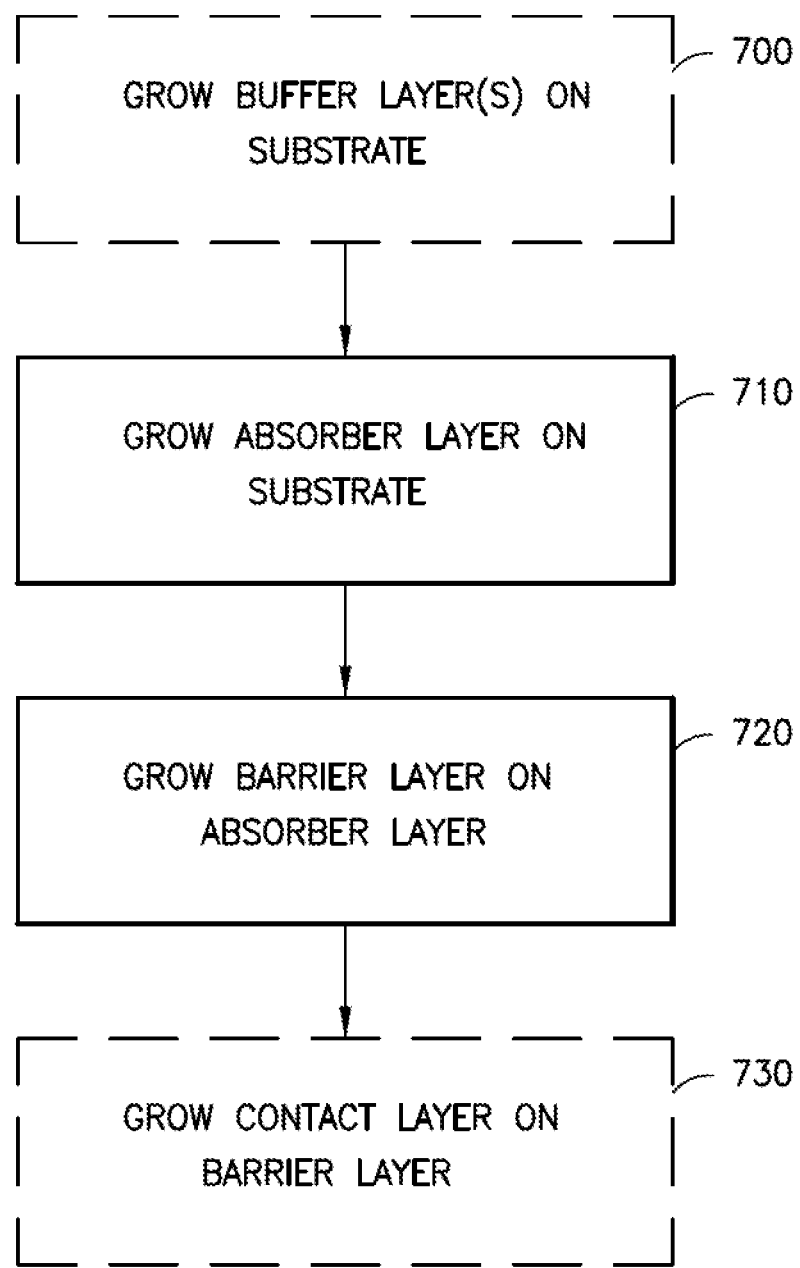

Having thus described examples of the present disclosure in general terms, reference will now be made to the accompanying drawings, which are not necessarily drawn to scale, and wherein like reference characters designate the same or similar parts throughout the several views, and wherein:

FIG. 1 is a schematic diagram of a shortwave infrared photodetector in accordance with aspects of the present disclosure;

FIG. 2 is a schematic energy band diagram of a shortwave infrared photodetector in accordance with aspects of the present disclosure;

FIG. 3 is a schematic diagram of a portion of a shortwave infrared photodetector in accordance with aspects of the present disclosure;

FIG. 4 is a schematic diagram of a portion of a shortwave infrared photodetector in accordance with aspects of the present disclosure;

FIG. 5 is a diagram illustrating quantum efficiencies of shortwave infrared photodetectors in accordance with aspects of the present disclosure;

FIG. 6 is a schematic illustration of a shortwave infrared photodetector in accordance with aspects of the present disclosure; and FIG. 7 is a flow diagram of a method in accordance with aspects of the present disclosure.

DETAILED DESCRIPTION

Referring to FIGS. 1 and 6, the aspects of the present disclosure described herein provide a shortwave infrared photodetector 100, 100A having a cutoff wavelength $\lambda$ of about 3 µm where in one aspect, the shortwave infrared photodetector 100, 100A is configured to detect infrared electromagnetic radiation having a wavelength $\lambda$ ranging from about 0.8 µm to about 3 µm. The shortwave infrared photodetector 100, 100A includes a graded absorber layer 115 of gallium indium arsenide (GaInAs) or aluminum indium arsenide (AlInAs). The graded absorber layer 115 includes a molar concentration grading 160 that may be sufficiently large to generate an internal quasi-electric field of a sufficient magnitude to overcome the loss of minority carriers to recombination at the valence band, which results in a shortwave infrared photodetector that may have a quantum efficiency (QE) of greater than about 55% when the photodetector is uncoated (e.g., lacks optical-enhancing coatings such as antireflective coatings) and a quantum efficiency of greater than about 85% when an antireflective coating is applied to the shortwave infrared photodetector. The graded absorber layer 115, in accordance with aspects of the present disclosure, may also minimize crosstalk between pixels 600A, 600B, 600C of the shortwave infrared photodetector 100A (e.g., when compared to a photodetector with a uniform composition absorber layer) due to, for example, the quasi-electric field generated by the graded absorber layer 115. The reduced crosstalk between the pixels 600A, 600B, 600C of the shortwave infrared photodetector 100A may also improve the modulation transfer function of a focal plane array FPA formed by an array 600 of shortwave infrared photodetectors 100.

The aspects of the present disclosure may be applied to any suitable imaging application such as for example, high operating temperature (e.g., about 100K to about 150K) short wave to medium wave focal plane arrays for guided munitions and unmanned aerospace systems. In other aspects, the present disclosure may be applied to any suitable imaging systems such as forward looking infrared imagers for the detection of any suitable terrestrial (land, air or sea) or extraterrestrial objects.

Illustrative, non-exhaustive examples, which may or may not be claimed, of the subject matter according to the present disclosure are provided below.

Referring to FIG. 1, in one aspect, the shortwave infrared photodetector 100 includes a substrate 110, a barrier layer 120 and an absorber layer 115 disposed between the substrate 110 and the barrier layer 120. In one aspect, the absorber layer 115 comprises aluminum indium arsenide (AlInAs), while in other aspects, the absorber layer 115 comprises gallium indium arsenide (GaInAs). In one aspect the substrate 110 comprises gallium antimonide (GaSb) while in other aspects, the substrate 110 may comprise indium arsenide (InAs), indium phosphide (InP) or gallium arsenide (GaAs). In one aspect, the substrate 110 material depends on the absorber layer 115 material such that a lattice structure 110L of the substrate 110 and a lattice structure 115L of the absorber layer 115 are mismatched.

The shortwave infrared photodetector 100 also includes a contact layer 125 that is interfaced with the barrier layer 120. In one aspect, the shortwave infrared photodetector 100 may have an nBn photodetector structure where the absorber layer 115 and contact layer 125 are constructed of n-type semiconductor materials while in other aspects the shortwave infrared photodetector 100 may have a pBp (e.g., the absorber layer 115 and contact layer 125 are constructed of p-type semiconductor materials), pBn (e.g., the absorber layer 115 is constructed of a n-type semiconductor material and the contact layer 125 is constructed of a p-type semiconductor material), or nBp (e.g., the absorber layer 115 is constructed of a p-type semiconductor material and the contact layer 125 is constructed of a n-type semiconductor material) photodetector structure. The semiconductor material of the barrier layer 120 may be matched to the semiconductor material of the absorber layer 115. In one aspect, one or more of the absorber layer 115, barrier layer 120 and contact layer 125 may be doped while in other aspect, at least one of the absorber layer 115, barrier layer 120 and contact layer 125 is undoped.

In one aspect of the present disclosure, at least one buffer layer 130 is disposed between the substrate 110 and the absorber layer 115. The at least one buffer layer 130 may comprise one or more of III-V compound semiconducting layers. In one aspect, any suitable antireflective coating 135 may be provided, such as on the substrate 110, where the antireflective coating 135 increases the quantum efficiency (QE) of an uncoated shortwave infrared photodetector 100 by up to about 30%.

Referring now to FIGS. 1-5, as described above, the absorber layer 115 may be a p-type absorber layer 115p (e.g. comprises a p-type semiconductor material) or an n-type absorber layer 115n (e.g., comprises a n-type semiconductor material). Where the absorber layer 115 comprises a p-type absorber layer 115p the minority carriers 220p are the free electrons and the majority carriers 300p are the holes. Where the absorber layer 115 comprises a n-type absorber layer 115n the minority carriers 220n are the holes and the majority carriers 300n are the free electrons. The absorber layer 115, whether a p-type or a n-type absorber layer, includes a molar concentration grading 160 that is configured to produce a quasi-electric field 200 that overcomes a loss of minority carriers 220p, 220n to recombination at the valence band 230. In one aspect, the quasi-electric field is about 70 meV/µm to about 80 meV/µm, while in other aspects, the quasi-electric field 200 produced by the molar concentration grading may be greater than 70 meV/µm, greater than about 80 meV/µm or less than about 70 meV/µm.

In one aspect, the molar concentration grading 160 provides for a thickness T of the absorber layer 115 of between about 2 µm and about 5 µm where the thicker the absorber layer, the more incident infrared electromagnetic radiation 250 energy can be absorbed by the absorber layer 115. The molar concentration grading 160 of the absorber layer 115 results in an uncoated quantum efficiency of greater than about 40% and a coated (e.g., such as with an antireflective coating) quantum efficiency of about greater than about 85%. In one aspect, where the absorber layer 115 comprises aluminum indium arsenide (AlInAs), the absorber layer 115 may have a chemical composition of $Al_xIn_{1-x}As$ where X has a value of about 0.07 adjacent the substrate 110 and a value of about 0.02 adjacent the barrier layer 120. In one aspect, where the absorber layer 115 comprises gallium indium arsenide (GaInAs), the absorber layer 115 may have a chemical composition of $Ga_xIn_{1-x}As$ where X has a value of about 0.16 adjacent the substrate 110 and value of about 0.07 adjacent the barrier layer 120.

As can be seen in the exemplary band diagram of FIG. 2, which illustrates the valence band 230 and conduction band 240 as well as the bandgap there between, incident infrared electromagnetic radiation 250 having any suitable wavelength λ and impinging on the absorber layer 115 generates carriers (e.g. the minority and majority carriers) where the energy of the incoming photons is used to bring an electron from a lower energy level to a higher energy level. In the case where an electron is removed from the valence band 230 and added to the conduction band 240, an electron-hole pair is generated. In FIG. 2, the carrier 220 which is a hole carrying a positive charge from the incident electromagnetic radiation 250, is driven in direction 210 through the absorber layer 115 towards the contact layer 125 by the quasi-electric field 200. The molar concentration grading 160 of the absorber layer 115 that generates the quasi-electric field 200 is illustrated as the sloped portion of the valence band 230. As described above, the quasi-electric field 200 prevents recombination of the carrier 220 which provides for a greater detection of the infrared electromagnetic radiation 250 photons carried by the carrier 220 and thereby increasing the quantum efficiency (QE) of the shortwave infrared photodetector 100.

FIG. 5, is a chart illustrating the increased quantum efficiency (QE) of the shortwave infrared photodetector 100 provided by the graded absorber layer 115 of the present disclosure compared to conventional shortwave infrared photodetectors having absorber layers with a uniform composition. It is noted that the quantum efficiencies (QE) illustrated in the chart of FIG. 5 are for uncoated shortwave infrared photodetectors. As an example, a photodetector having a gallium indium arsenide absorber layer with a uniform composition of $Ga_{0.15}In_{0.85}As$ is shown to have a quantum efficiency of about 15%. In accordance with the present disclosure, where the absorber layer 115 is graded so that the absorber layer 115 has a chemical composition of $Ga_XIn_{1-X}As$ where X is between 0.16 and 0.07, the shortwave infrared photodetector 100 has a quantum efficiency of about 43% and generates a quasi-electric field of about 74 meV/μm.

As another example, a photodetector having an aluminum indium arsenide absorber layer with a uniform composition of $Al_{0.05}In_{0.95}As$ is shown to have a quantum efficiency of about 22%. In accordance with the present disclosure, where the absorber layer 115 is graded so that the absorber layer 115 has a chemical composition of $Al_XIn_{1-X}As$ where X is between 0.05 and 0.02, the shortwave infrared photodetector 100 has a quantum efficiency of about 52% and produces a quasi-electric field 200 of about 57 meV/μm. As another example of the present disclosure, where the absorber layer 115 is graded so that the absorber layer 115 has a chemical composition of $Al_XIn_{1-X}As$ where X is between 0.07 and 0.02, the shortwave infrared photodetector 100 has a quantum efficiency of about 55% and produces a quasi-electric field 200 of about 80 meV/μm.

As described above, the quasi-electric field 200 generated by the molar concentration grading 160 of the absorber layer 115 may be sufficient to overcome the loss of minority carriers 220p, 220n to recombination. The quasi-electric field 200 generated by the molar concentration grading 160 of the absorber layer 115 may also prevent crosstalk between adjacent shortwave infrared photodetectors 100, such as when the shortwave infrared photodetectors 100 are arranged in an array and function as pixels, by channeling the carriers 220, that carry the positive charge from the incident electromagnetic radiation 250, between the valence band 230 and conduction band 240 of a respective shortwave infrared photodetectors 100 and preventing migration of the carriers 220 between adjacent shortwave infrared photodetectors 100.

Referring now to FIG. 6, a shortwave infrared photodetector 100A is illustrated. In this aspect, the shortwave infrared photodetector 100A includes an array 600 of pixels 600A, 600B, 600C that form a focal plane array FPA of the shortwave infrared photodetector 100A. The array 600 may be an n×m array having at least one n rows of pixels and at least one m rows of pixels where n and m depend on a desired resolution of the shortwave infrared photodetector 100A. Each of the pixels 600A, 600B, 600C is similar to shortwave infrared photodetector 100 such that each of the pixels 600A, 600B, 600C include the substrate 110, absorber layer 115, barrier layer 120 and contact layer 125. In one aspect, each of the pixels 600A, 600B, 600C also includes at least one buffer layer 130 between the absorber layer and substrate. In one aspect, the substrate 110 is common to each of the pixels 600A, 600B, 600C where, for example, the pixels are grown on a single substrate 110, while in other aspects, each pixel may include a respective substrate that is distinct from the substrate of at least one other pixel. In one aspect, the substrate 110 may also include any suitable antireflective coating 135.

Here, the molar concentration grading 160 of the absorber layer 115 of each pixel 600A, 600B, 600C channels the respective carriers 220 (carrying the photon from the incident infrared electromagnetic radiation 250) towards the contact layer 125 for detection by a respective photocurrent detector 610A, 610B, 610C. A change in signal level output of the respective photocurrent detector 610A, 610B, 610C, due to the interaction with the photon from the incident infrared electromagnetic radiation 250, is converted into a multiplexed (or time multiplexed) electrical signal, in any suitable manner, by any suitable circuit such as readout integrated circuit 625. The multiplexed (or time multiplexed) electrical signals from the readout integrated circuit 625 are sent to any suitable controller, such as controller 620, that is configured to generate an image based on the multiplexed (or time multiplexed) electrical signals, where for example, that image corresponds to one or more objects OBJ being detected. In one aspect, the controller 620 may be configured to apply any suitable biasing voltage, from any suitable voltage source, to each of the pixels 600A, 600B, 600C of the shortwave infrared photodetector 100A through a common contact 640 disposed on, for example, the substrate and a contact 641, 642, 643 disposed on each of the pixels 600A, 600B, 600C. In one aspect, the quasi-electric voltage 200 generated by the absorber layer 115 may add to the biasing voltage to further increase the quantum efficiency of the shortwave infrared photodetector 100A.

Referring now to FIGS. 1, 6 and 7, in accordance with an aspect of the present disclosure a method of forming the shortwave infrared photodetector 100, 100A is provided. For example, the method of forming a shortwave infrared photodetector 100, 100A includes growing an absorber layer 115 on a substrate 110 (FIG. 7, block 710) where the absorber layer 115 is grown such that the absorber layer 115 has a molar concentration grading 160 that effects an uncoated quantum efficiency of greater than about 40 percent. In accordance with one aspect of the present disclosure, the absorber layer is grown to have a chemical composition of $Al_XIn_{1-X}As$ where X has a value of 0.07 adjacent the substrate and a value of 0.02 adjacent the barrier layer. In accordance with one aspect of the present disclosure, the absorber layer is grown to have a chemical composition of $Ga_XIn_{1-X}As$ where X has a value of 0.16 adjacent the substrate and a value of 0.07 adjacent the barrier layer.

In one aspect, the method also includes growing a barrier layer 120 on the absorber layer 115 (FIG. 7, block 720). In one aspect, at least one buffer layer 130 is grown on the substrate 110 between the substrate 110 and the absorber layer 115 (FIG. 7, block 700). In one aspect, the method further includes growing a contact layer 125 on the barrier layer 120 (FIG. 7, block 730).

The absorber layer 115 and the barrier layer 120, as well as the other layers of the shortwave infrared photodetector 100, 100A are formed by one or more of molecular beam epitaxy, metal organic chemical vapor deposition, and liquid phase epitaxy.

The following are provided in accordance with the aspects of the present disclosure:

A1. An infrared photodetector comprising:
a substrate;
a barrier layer; and
an absorber layer disposed between the substrate and the barrier layer, the absorber layer having a molar concentration grading that results in an uncoated quantum efficiency of greater than about 40 percent.

A2. The infrared photodetector of paragraph A1, wherein a magnitude of the molar concentration grading of the absorber layer is such that the absorber layer generates an internal quasi-electric field that overcomes a loss of minority carriers to recombination.

A3. The infrared photodetector of paragraph A1, further comprising an antireflective coating disposed on the substrate.

A4. The infrared photodetector of paragraph A1, wherein the infrared photodetector has an operating temperature of about 100 degrees Kelvin to about 150 degrees Kelvin.

A5. The infrared photodetector of paragraph A1, wherein the infrared photodetector is a shortwave infrared detector having a cutoff wavelength of about 3 μm.

A6. The infrared photodetector of paragraph A1, wherein the infrared photodetector is a shortwave infrared detector configured to detect infrared radiation having wavelengths of about 0.8 μm to about 3 μm.

A7. The infrared photodetector of paragraph A1, wherein the substrate comprises gallium antimonide (GaSb).

A8. The infrared photodetector of paragraph A1, wherein the substrate comprises indium arsenide (InAs).

A9. The infrared photodetector of paragraph A1, wherein the substrate comprises indium phosphide (InP).

A10. The infrared photodetector of paragraph A1, wherein the substrate comprises gallium arsenide (GaAs).

A11. The infrared photodetector of paragraph A1, wherein the absorber layer comprises Aluminum, Indium and Arsenic having a chemical composition of $Al_xIn_{1-x}As$ where X has a value of between 0.07 and 0.02.

A12. The infrared photodetector of paragraph A1, wherein the absorber layer comprises Gallium, Indium and Arsenic having a chemical composition of $Ga_xIn_{1-x}As$ where X has a value of between 0.16 and 0.07.

A13. The infrared photodetector of paragraph A1, wherein the molar concentration grading of the absorber layer is configured to produce a quasi-electric field greater than about 70 meV/μm.

A14. The infrared photodetector of paragraph A1 wherein the substrate and the absorber layer are lattice mismatched.

A15. The infrared photodetector of paragraph A1, wherein the absorber layer has a thickness between about 2 μm and about 5 μm.

A16. The infrared photodetector of paragraph A1, further comprising at least one buffer layer disposed between the absorber layer and the substrate.

A17. The infrared photodetector of paragraph A1, further comprising a contact layer adjacent the barrier layer.

B1. An infrared photodetector comprising:
a plurality of pixels forming an array of two or more pixels, the plurality of pixels having
a substrate;
a barrier layer; and
an absorber layer disposed between the substrate and the barrier layer, the absorber layer having a molar concentration grading that results in an uncoated quantum efficiency of greater than about 40 percent.

B2. The infrared photodetector of paragraph B1, wherein the molar concentration grading of the absorber layer is configured to minimize cross-talk between pixels in the array of two or more pixels when compared to a uniform absorber layer having elemental identity with the absorber layer and a uniform molar concentration.

B3. The infrared photodetector of paragraph B1, wherein a magnitude of the molar concentration grading of the absorber layer is such that the absorber layer generates an internal quasi-electric field that overcomes a loss of minority carriers to recombination.

B4. The infrared photodetector of paragraph B1, further comprising an antireflective coating disposed on the substrate.

B5. The infrared photodetector of paragraph B1, wherein the infrared photodetector has an operating temperature of about 100 degrees Kelvin to about 150 degrees Kelvin.

B6. The infrared photodetector of paragraph B1, wherein the infrared photodetector is a shortwave infrared detector having a cutoff wavelength of about 3 μm.

B7. The infrared photodetector of paragraph B1, wherein the infrared photodetector is a shortwave infrared detector configured to detect infrared radiation having wavelengths of about 0.8 μm to about 3 μm.

B8. The infrared photodetector of paragraph B1, wherein the substrate comprises gallium antimonide (GaSb).

B9. The infrared photodetector of paragraph B1, wherein the substrate comprises indium arsenide (InAs).

B10. The infrared photodetector of paragraph B1, wherein the substrate comprises indium phosphide (InP).

B11. The infrared photodetector of paragraph B1, wherein the substrate comprises gallium arsenide (GaAs).

B12. The infrared photodetector of paragraph B1, wherein the absorber layer comprises Aluminum, Indium and Arsenic having a chemical composition of $Al_xIn_{1-x}As$ where X has a value of between 0.07 and 0.02.

B13. The infrared photodetector of paragraph B1, wherein the absorber layer comprises Gallium, Indium and Arsenic having a chemical composition of $Ga_xIn_{1-x}As$ where X has a value of between 0.16 and 0.07.

B14. The infrared photodetector of paragraph B1, wherein the molar concentration grading of the absorber layer is configured to produce a quasi-electric field of greater than about 70 meV/μm.

B15. The infrared photodetector of paragraph B1 wherein the substrate and the absorber layer are lattice mismatched.

B16. The infrared photodetector of paragraph B1, wherein the absorber layer has a thickness between about 2 μm and about 5 μm.

B17. The infrared photodetector of paragraph B1, further comprising at least one buffer layer disposed between the absorber layer and the substrate.

B18. The infrared photodetector of paragraph B1, further comprising a contact layer adjacent the barrier layer.

C1. Method of forming an infrared photodetector comprising:
growing an absorber layer on a substrate;
growing a barrier layer on the absorber layer; and
wherein the absorber layer is grown such that the absorber layer has a molar concentration grading that effects an uncoated quantum efficiency of greater than about 40 percent.

C2. The method of paragraph C1, wherein the absorber layer is grown to have a chemical composition of $Al_xIn_{1-x}As$ where X has a value of 0.07 adjacent the substrate and a value of 0.02 adjacent the barrier layer.

C3. The method of paragraph C1, wherein the absorber layer is grown to have a chemical composition of $Ga_xIn_{1-x}As$ where X has a value of 0.16 adjacent the substrate and a value of 0.07 adjacent the barrier layer.

C4. The method of paragraph C1, further comprising growing at least one buffer layer between the absorber layer and the substrate.

C5. The method of paragraph C1, wherein the absorber layer and the barrier layer are formed by molecular beam epitaxy.

C6. The method of paragraph C1, wherein the absorber layer and the barrier layer are formed by metal organic chemical vapor deposition.

C7. The method of paragraph C1, wherein the absorber layer and the barrier layer are formed by liquid phase epitaxy.

C8. The method of paragraph C1, further comprising growing a contact layer on the barrier layer.

C9. The method of paragraph C8, wherein the contact layer is formed by molecular beam epitaxy.

C10. The method of paragraph C8, wherein the contact layer is formed by metal organic chemical vapor deposition.

C11. The method of paragraph C8, wherein the contact layer is formed by liquid phase epitaxy.

In the figures, referred to above, solid lines, if any, connecting various elements and/or components may represent mechanical, electrical, fluid, optical, electromagnetic, wireless and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the drawings may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in the figures, may be combined in various ways without the need to include other features described in the figures, other drawing figures, and/or the accompanying disclosure, even though such combination or combinations are not explicitly illustrated herein. Similarly, additional features not limited to the examples presented, may be combined with some or all of the features shown and described herein.

In FIG. 7, referred to above, the blocks may represent operations and/or portions thereof and lines connecting the various blocks do not imply any particular order or dependency of the operations or portions thereof. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented. FIG. 7 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, those skilled in the art will appreciate that not all operations described need be performed.

In the foregoing description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims, if any, are presented for illustrative purposes only and are not intended to limit the scope of the claimed subject matter to the specific examples provided in the present disclosure.

What is claimed is:

1. An infrared photodetector comprising:
   a substrate;
   a barrier layer; and
   an absorber layer disposed between the substrate and the barrier layer, the absorber layer having a molar concentration grading that results in an uncoated quantum efficiency of greater than about 40 percent.

2. The infrared photodetector of claim 1, wherein a magnitude of the molar concentration grading of the absorber layer is such that the absorber layer generates an internal quasi-electric field that overcomes a loss of minority carriers to recombination.

3. The infrared photodetector of claim 1, further comprising an antireflective coating disposed on the substrate.

4. The infrared photodetector of claim 1, wherein the infrared photodetector is a shortwave infrared detector having a cutoff wavelength of about 3 μm.

5. The infrared photodetector of claim 1, wherein the absorber layer comprises Aluminum, Indium and Arsenic having a chemical composition of $Al_XIn_{1-X}As$ where X has a value of between 0.07 and 0.02.

6. The infrared photodetector of claim 1, wherein the absorber layer comprises Gallium, Indium and Arsenic having a chemical composition of $Ga_XIn_{1-X}As$ where X has a value of between 0.16 and 0.07.

7. The infrared photodetector of claim 1, wherein the molar concentration grading of the absorber layer is configured to produce a quasi-electric field of greater than about 70 meV/μm.

8. The infrared photodetector of claim 1 wherein the substrate and the absorber layer are lattice mismatched.

9. The infrared photodetector of claim 1, wherein the absorber layer has a thickness between about 2 μm and about 5 μm.

10. An infrared photodetector comprising:
a plurality of pixels forming an array of two or more pixels, the plurality of pixels having
a substrate;
a barrier layer; and
an absorber layer disposed between the substrate and the barrier layer, the absorber layer having a molar concentration grading that results in an uncoated quantum efficiency of greater than about 40 percent.

11. The infrared photodetector of claim 10, wherein the molar concentration grading of the absorber layer is configured to minimize cross-talk between pixels in the array of two or more pixels when compared to a uniform absorber layer having elemental identity with the absorber layer and a uniform molar concentration.

12. The infrared photodetector of claim 10, wherein a magnitude of the molar concentration grading of the absorber layer is such that the absorber layer generates an internal quasi-electric field that overcomes a loss of minority carriers to recombination.

13. The infrared photodetector of claim 10, further comprising an antireflective coating disposed on the substrate.

14. The infrared photodetector of claim 10, wherein the absorber layer comprises Aluminum, Indium and Arsenic having a chemical composition of $Al_XIn_{1-X}As$ where X has a value of between 0.07 and 0.02.

15. The infrared photodetector of claim 10, wherein the absorber layer comprises Gallium, Indium and Arsenic having a chemical composition of $Ga_XIn_{1-X}As$ where X has a value of between 0.16 and 0.07.

16. The infrared photodetector of claim 10, wherein the molar concentration grading of the absorber layer is configured to produce a quasi-electric field of greater than about 70 meV/μm.

17. The infrared photodetector of claim 10, wherein the absorber layer has a thickness between about 2 μm and about 5 μm.

18. Method of forming an infrared photodetector comprising:
growing an absorber layer on a substrate;
growing a barrier layer on the absorber layer; and
wherein the absorber layer is grown such that the absorber layer has a molar concentration grading that effects an uncoated quantum efficiency of greater than about 40 percent.

19. The method of claim 18, wherein the absorber layer is grown to have a chemical composition of $Al_XIn_{1-X}As$ where X has a value of 0.07 adjacent the substrate and a value of 0.02 adjacent the barrier layer.

20. The method of claim 18, wherein the absorber layer is grown to have a chemical composition of $Ga_XIn_{1-X}As$ where X has a value of 0.16 adjacent the substrate and a value of 0.07 adjacent the barrier layer.

* * * * *